US010026521B2

(12) United States Patent
Scheel et al.

(10) Patent No.: US 10,026,521 B2
(45) Date of Patent: Jul. 17, 2018

(54) USE OF PEDOT/PSS DISPERSIONS OF HIGH PEDOT CONTENT FOR THE PRODUCTION OF CAPACITORS AND SOLAR CELLS

(71) Applicant: Heraeus Precious Metals GmbH & Co. KG, Hanau (DE)

(72) Inventors: Arnulf Scheel, Köln (DE); Katrin Asteman, Köln (DE); Matthias Intelmann, Köln (DE); Andreas Elschner, Mülheim an der Ruhr (DE)

(73) Assignee: Heraeus Precious Metals GmbH & Co. KG, Hanau (DE)

( * ) Notice: Subject to any disclaimer, the term of this patent is extended or adjusted under 35 U.S.C. 154(b) by 405 days.

(21) Appl. No.: 14/431,419

(22) PCT Filed: Sep. 25, 2013

(86) PCT No.: PCT/EP2013/002870
§ 371 (c)(1),
(2) Date: Mar. 26, 2015

(87) PCT Pub. No.: WO2014/048561
PCT Pub. Date: Apr. 3, 2014

(65) Prior Publication Data
US 2015/0279503 A1    Oct. 1, 2015

Related U.S. Application Data

(60) Provisional application No. 61/711,408, filed on Oct. 9, 2012.

(30) Foreign Application Priority Data

Sep. 27, 2012 (DE) .................. 10 2012 018 978

(51) Int. Cl.
*B05D 5/12* (2006.01)
*H01G 9/00* (2006.01)
(Continued)

(52) U.S. Cl.
CPC ............ *H01B 1/127* (2013.01); *C09D 165/00* (2013.01); *H01G 9/0036* (2013.01); *H01G 9/025* (2013.01);
(Continued)

(58) Field of Classification Search
CPC .... H01B 1/127; H01L 51/441; H01G 9/0036; H01G 9/045
(Continued)

(56) References Cited

U.S. PATENT DOCUMENTS 4,910,645 A    3/1990 Jonas et al.
7,497,879 B2    3/2009 Kakuma et al.
(Continued)

FOREIGN PATENT DOCUMENTS

CN    1610027 A    4/2005
DE    102004022674    11/2005
(Continued)

OTHER PUBLICATIONS

PCT International Preliminary Report on Patentability in PCT/EP2013/002870, dated May 19, 2014, 11 pages.
(Continued)

*Primary Examiner* — Eric Thomas
*Assistant Examiner* — Arun Ramaswamy
(74) *Attorney, Agent, or Firm* — Servilla Whitney LLC

(57) ABSTRACT

Described are processes for the production of a capacitor, comprising the process steps:
a) the provision of an electrode body of an electrode material, wherein a dielectric covers one surface of this electrode material at least partly to form an anode body;
b) the introduction of a dispersion comprising a dispersing agent and complexes of polythiophenes and polyanions, wherein the weight ratio of polythiophenes:polyanions in the dispersion is greater than 0.5, into at least a part of the anode body;
(Continued)

c) the at least partial removal of the dispersing agent to obtain a solid electrolyte in a capacitor body.

Also described are capacitors, electronic circuits, uses of these capacitors, processes for the preparation of dispersions, dispersions obtainable by these processes, organic solar cells, processes for the production of these organic solar cells, and the use of dispersion for the production of organic solar cells.

8 Claims, 2 Drawing Sheets

(51) Int. Cl.
| | |
|---|---|
| H01G 9/02 | (2006.01) |
| B01J 13/00 | (2006.01) |
| H01M 6/14 | (2006.01) |
| H01B 1/12 | (2006.01) |
| H01G 9/028 | (2006.01) |
| H01L 51/00 | (2006.01) |
| H01L 51/42 | (2006.01) |
| H01L 51/44 | (2006.01) |
| C09D 165/00 | (2006.01) |
| H01G 11/48 | (2013.01) |
| H01G 11/56 | (2013.01) |
| H01G 9/025 | (2006.01) |
| H01G 9/045 | (2006.01) |
| H01G 9/048 | (2006.01) |
| H01G 9/15 | (2006.01) |
| C08G 61/12 | (2006.01) |

(52) U.S. Cl.
CPC ............ *H01G 9/028* (2013.01); *H01G 9/045* (2013.01); *H01G 9/048* (2013.01); *H01G 9/151* (2013.01); *H01G 11/48* (2013.01); *H01G 11/56* (2013.01); *H01L 51/0037* (2013.01); *H01L 51/4253* (2013.01); *H01L 51/441* (2013.01); *C08G 61/126* (2013.01); *C08G 2261/3223* (2013.01); *C08G 2261/794* (2013.01); *C08G 2261/91* (2013.01); *H01G 9/15* (2013.01); *Y02E 10/549* (2013.01); *Y02E 60/13* (2013.01); *Y02P 70/521* (2015.11); *Y10T 29/417* (2015.01)

(58) Field of Classification Search
USPC .................................. 361/523, 525, 526
See application file for complete search history.

(56) References Cited

U.S. PATENT DOCUMENTS

| | | |
|---|---|---|
| 8,456,803 B2 | 6/2013 | Merker et al. |
| 8,696,768 B2 | 4/2014 | Merker et al. |
| 8,699,208 B2 | 4/2014 | Merker et al. |
| 8,882,856 B2 | 11/2014 | Intelmann et al. |
| 2005/0111165 A1 | 5/2005 | Merker |
| 2008/0163927 A1 | 7/2008 | Sohn et al. |
| 2010/0165546 A1 | 7/2010 | Yoshida et al. |
| 2011/0210321 A1 | 9/2011 | Elschner et al. |
| 2012/0039019 A1 | 2/2012 | Zednickova |
| 2012/0097249 A1 | 4/2012 | Klenkler et al. |

FOREIGN PATENT DOCUMENTS

| | | |
|---|---|---|
| DE | 102005043828 | 3/2007 |
| DE | 102009007594 | 8/2010 |
| DE | 102010047087 | 4/2012 |
| DE | 102011013068 | 9/2012 |
| EP | 0340512 | 11/1989 |
| JP | 2003309041 A | 10/2003 |
| JP | 2005048091 A | 2/2005 |
| JP | 2007096284 | 4/2007 |
| JP | 2007142070 | 6/2007 |
| JP | 2008109069 | 5/2008 |
| JP | 2008311582 A | 12/2008 |
| JP | 2011176305 A1 | 1/2011 |
| WO | WO 2009/141209 | 11/2009 |
| WO | WO 2010/003874 | 1/2010 |
| WO | 2012/041506 A2 | 4/2012 |
| WO | 2012/119711 A1 | 9/2012 |

OTHER PUBLICATIONS

PCT International Search Report in PCT/EP2013/002870, dated Mar. 31, 2015, 6 pages.
PCT International Written Opinion in PCT/EP2013/002870, dated May 19, 2014, 10 pages.

USE OF PEDOT/PSS DISPERSIONS OF HIGH PEDOT CONTENT FOR THE PRODUCTION OF CAPACITORS AND SOLAR CELLS

CROSS-REFERENCE TO RELATED APPLICATIONS

This application is a national phase entry of PCT Application No. PCT/EP2013/002870, filed Sep. 25, 2013, which claims priority to U.S. Provisional Application No. 61/711,408 filed Oct. 9, 2012 and German Application No. 10 2012 018 978.8, filed Sep. 27, 2012, the entire contents of which are hereby incorporated by reference.

FIELD

The present invention relates to a process for the production of a capacitor, the capacitor obtainable by this process, a capacitor, electronic circuits, the use of a capacitor, a process for the preparation of a dispersion, the dispersion obtainable by this process, a process for the production of an organic solar cell, the organic solar cell obtainable by this process and the use of a dispersion for the production of an organic solar cell.

BACKGROUND

A commercially available electrolyte capacitor as a rule is made of a porous metal electrode, an oxide layer serving as a dielectric on the metal surface, an electrically conductive material, usually a solid, which is introduced into the porous structure, an outer electrode (contacting), such as e.g. a silver layer, and further electrical contacts and an encapsulation. An electrolyte capacitor which is frequently used is the tantalum electrolytic capacitor, the anode electrode of which is made of the valve metal tantalum, on which a uniform, dielectric layer of tantalum pentoxide has been generated by anodic oxidation (also called "forming"). A liquid or solid electrolyte forms the cathode of the capacitor. Aluminium capacitors in which the anode electrode is made of the valve metal aluminium, on which a uniform, electrically insulating aluminium oxide layer is generated as the dielectric by anodic oxidation, are furthermore frequently employed. Here also, a liquid electrolyte or a solid electrolyte forms the cathode of the capacitor. The aluminium capacitors are usually constructed as wound- or stacked-type capacitors.

π-conjugated polymers are particularly suitable as solid electrolytes in the capacitors described above because of their high electrical conductivity. π-conjugated polymers are also called conductive polymers or synthetic metals. They are increasingly gaining economic importance, since polymers have advantages over metals with respect to processability, weight and targeted adjustment of properties by chemical modification. Examples of known π-conjugated polymers are polypyrroles, polythiophenes, polyanilines, polyacetylenes, polyphenylenes and poly(p-phenylene-vinylenes), a particularly important polythiophene used industrially being poly(3,4-ethylenedioxythiophene) (PEDOT), since it has a very high conductivity in its oxidized form.

The solid electrolytes based on conductive polymers can be applied to the oxide layer in various ways. EP-A-0 340 512 thus describes, for example, the production of a solid electrolyte from 3,4-ethylenedioxythiophene and the use thereof in electrolytic capacitors. According to the teaching of this publication, 3,4-ethylenedioxythiophene is polymerized on to the oxide layer in situ.

The disadvantage of the production of solid electrolyte capacitors using an in situ polymerization is however, amongst others, the complexity of the process. Thus, a polymerization process which in each case includes the process steps of impregnation, polymerization and where appropriate washing as a rule lasts several hours. Under certain circumstances, readily flammable or toxic solvents must also be employed here. A further disadvantage of the in situ process for the production of solid electrolytic capacitors is that as a rule anions of the oxidizing agent or, where appropriate, other monomeric anions serve as counter-ions for the conductive polymer. Because of their small size, however, these are not bonded to the polymer in a sufficiently stable manner. As a result, diffusion of the counter-ions and therefore an increase in the equivalent series resistance (ESR) of the capacitor may occur, especially at elevated use temperatures of the capacitor. The alternative use of high molecular weight polymeric counter-ions in the chemical in situ polymerization does not lead to sufficiently conductive films and therefore does not lead to low ESR values.

In addition to the in situ polymerization described above, processes for the production of solid electrolytes in capacitors in which a dispersion comprising the already polymerized thiophene and a polyanion as a counter-ion, for example the PEDOT/PSS dispersions known from the prior art, is applied to the oxide layer and the dispersing agent is then removed by evaporation are also known from the prior art. Such a process for the production of solid electrolyte capacitors is disclosed, for example, in DE-A-10 2005 043 828. According to the teaching of this publication, the solid electrolyte layer in the capacitor is produced starting from a PEDOT/PSS dispersion, which particularly preferably has a weight ratio of polyanion (PSS) to conductive polymer (PEDOT) in a range of from 2:1 to 20:1. In the examples of DE-A-10 2005 043 828 a weight ratio of PSS to PEDOT of 2.23:1 is chosen.

A disadvantage of the capacitors obtained by employing such dispersions, however, is inter alia that on the one hand they have a comparatively low capacitance and a comparatively high series resistance, and that on the other hand they are characterized by unsatisfactory low temperature properties. "Low temperature properties" of a capacitor in this context are understood as meaning the influencing of the electrical characteristic values thereof, such as, for example, the capacitance, the equivalent series resistance, the breakdown voltage or the residual current, but in particular the influencing of the capacitance, at low temperatures, in particular at temperatures down to below −60° C.

In addition to the use for the production of solid electrolyte layers in capacitors, the PEDOT/PSS dispersions known from the prior art are often also used for the production of conductive layers in organic solar cells. Thus, PEDOT/PSS dispersions are employed, for example, for the production of the intermediate layer between the ITO-coated substrate and the semiconductor layer in the standard construction of the P3HT:PCBM solar cell or for the production of a layer in a solar cell of inverted structure, such as is described, for example, in chapter 2.1 in the dissertation "*Zur Funktionsweise organischer Solarzellen auf der Basis interpenetrierender Donator/Akzeptor-Netzwerke*" (2007) by Markus Glatthaar. The PEDOT/PSS layer in this context is spun (e.g. by "spin coating") from an aqueous or isopropanol-based dispersion on to a substrate (ITO in the case of a solar cell of standard construction or a semiconductor layer, for example a P3HT:PCBM layer, in the case of a solar cell of inverted structure).

The disadvantage of employing the PEDOT/PSS dispersion known from the prior art having a weight ratio of PSS to PEDOT of more than 2:1 for the production of the abovementioned organic solar cells, in particular the organic solar cells of inverted structure, however, lies inter alia in the fact that these dispersions display comparably poor wetting properties, so that a PEDOT/PSS intermediate layer of constant layer thickness can be achieved only with difficulty by means of such dispersions.

SUMMARY

One aspect of the invention pertains to a method for the production of a capacitor,
the method comprising:
a) providing an electrode body of an electrode material, wherein a dielectric covers one surface of this electrode material at least partly under formation of an anode body;
b) introducing a dispersion comprising a dispersing agent and complexes of polythiophenes and polyanions, wherein the weight ratio of polythiophenes:polyanions in the dispersion is greater than 0.5, into at least a part of the anode body;
c) removing at least part of the dispersing agent under obtaining a solid electrolyte in a capacitor body.

Another aspect of the invention pertains to a capacitor obtainable by this method. A third aspect of the invention pertains to a capacitor comprising an electrode body of an electrode material, wherein a dielectric at least partly covers the surface of this electrode material and forms an anode body, wherein the anode body is at least partly coated with a solid electrolyte which comprises polythiophenes and polyanions, wherein the weight ratio of polythiophenes:polyanions in the solid electrolyte is greater than 0.5. A fourth aspect of the invention pertains to an electronic circuit comprising this capacitor.

A fifth aspect of the invention pertains to a method for the preparation of a dispersion comprising a dispersing agent and complexes of polythiophenes and polyanions, comprising the process step of oxidative polymerizing thiophene monomers in the presence of the polyanions in a liquid reaction phase comprising the dispersing agent, wherein the thiophene monomers and the polyanions are employed in a relative amount such that the weight ratio of thiophene monomers:polyanions in the liquid reaction phase is greater than 0.5. A sixth aspect of the invention pertains to a dispersion obtainable by this method.

A seventh aspect of the invention pertains to a method for the production of an organic solar cell comprising
A) a substrate layer;
B) a transparent anode layer;
C) a semiconductor layer;
D) a cathode layer;
the method comprising
    coating with a dispersion comprising a dispersing agent and complexes of polythiophenes and polyanions, wherein the weight ratio of polythiophenes:polyanions in the dispersion is greater than 0.5; and
    subsequently removing the dispersing agent, or by coating with a dispersion according to claim 22 and subsequent removal of the dispersing agent,
i) a layer which comprises complexes of polythiophenes and polyanions is applied to the substrate layer,
ii) a layer which comprises complexes of polythiophenes and polyanions is applied as an outer layer to the semiconductor layer, or
iii) a layer which comprises complexes of polythiophenes and polyanions is applied between the transparent anode layer and the semiconductor layer.

Another aspect of the invention pertains to an organic solar cell obtainable by this method.

DETAILED DESCRIPTION

Figure 1:
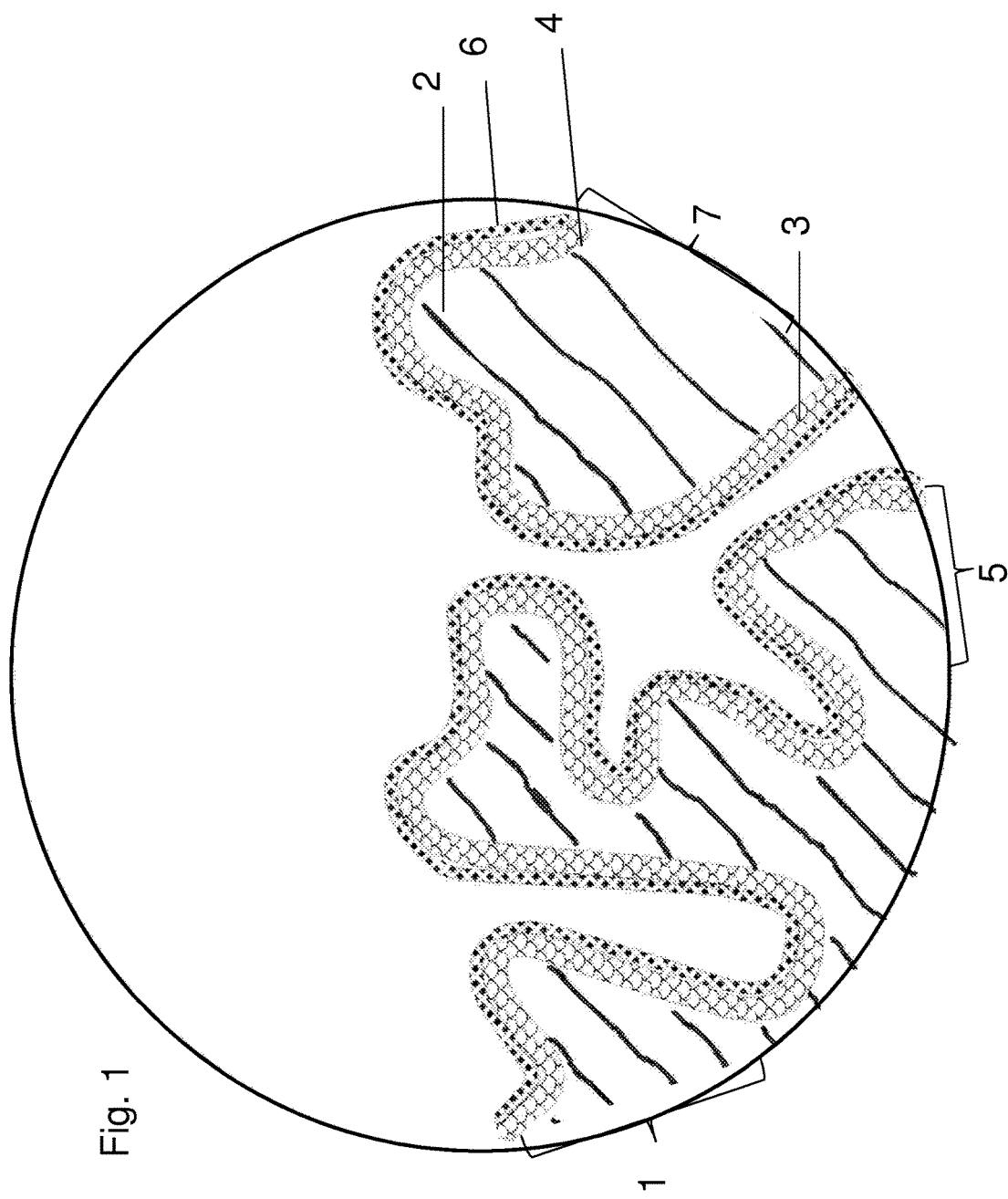
FIG. 1 shows a section though a part of a capacitor obtainable in accordance with one or more embodiments of the invention.

The present invention was based on the object of overcoming the disadvantages resulting from the prior art in connection with electronic components which comprise layers of compositions comprising conductive polymers and polyanions, in particular PEDOT/PSS layers, very particularly preferably in connection with solid electrolytic capacitors and organic solar cells which comprise PEDOT/PSS layers.

In particular, the present invention was based on the object of providing a process for the production of a capacitor, by means of which, with the lowest possible technical outlay, capacitors which, in addition to an equivalent series resistance which is as low as possible, show both an adequate capacitance and adequate low temperature properties can be provided.

The present invention was furthermore based in particular on the object of providing a process for the production of an organic solar cell, in particular an organic solar cell of inverted structure, in which, for example, PEDOT/PSS layers having a layer thickness which is as constant as possible can be applied.

The present invention was also based on the object of providing a process for the preparation, for example, of a PEDOT/PSS dispersion, by means of which dispersions which can be particularly advantageously employed in the processes described above for the production of a capacitor or for the production of an organic solar cell can be prepared.

A contribution towards achieving the abovementioned objects is made by a process for the production of a capacitor, comprising the process steps:
a) the provision of an electrode body of an electrode material, wherein a dielectric covers one surface of this electrode material at least partly under formation of an anode body;
b) the introduction of a dispersion comprising a dispersing agent and complexes of polythiophenes and polyanions, wherein the weight ratio of polythiophenes:polyanions in the dispersion is greater than 0.5, into at least a part of the anode body;
c) the at least partial removal of the dispersing agent under obtaining a solid electrolyte in a capacitor body.

It has been found, completely surprisingly, that the electrical characteristic values of a solid electrolyte capacitor, in particular the capacitance, the series resistance and the low temperature properties, can be improved compared with the capacitors known from the prior art which have been obtained by employing dispersions comprising complexes of polythiophenes and polyanions, such that the content of polythiophenes is increased further compared with the content of polyanions.

In process step a), an electrode body of an electrode material, wherein a dielectric covers one surface of this electrode material at least partly to form an anode body, is first provided.

In principle, the electrode body can be produced by pressing a valve metal powder of high surface area and sintering it to give a usually porous electrode body. An electrical contact wire, preferably of a valve metal, such as e.g. tantalum, is conventionally also pressed into the electrode body here. The electrode body is then coated, for example by electrochemical oxidation, with a dielectric, i.e. an oxide layer. Alternatively, metal foils can also be etched, and coated with a dielectric by electrochemical oxidation in order to obtain an anode foil having a porous region. In a wound capacitor, an anode foil having a porous region, which forms the electrode body, and a cathode foil are separated by separators and wound up.

In the context of the invention, valve metal is to be understood as meaning those metals of which the oxide layers do not render possible current flow equally in both directions. In the case of an anodically applied voltage, the oxide layers of the valve metals block the current flow, while in the case of a cathodically applied voltage large currents occur, which may destroy the oxide layer. The valve metals include Be, Mg, Al, Ge, Si, Sn, Sb, Bi, Ti, Zr, Hf, V, Nb, Ta and W and an alloy or compound of at least one of these metals with other elements. The best known representatives of the valve metals are Al, Ta and Nb. Compounds which have electrical properties comparable to a valve metal are those having metallic conductivity, which can be oxidized and of which the oxide layers have the properties described above. For example, NbO has metallic conductivity, but in general is not regarded as a valve metal. Layers of oxidized NbO have, however, the typical properties of valve metal oxide layers, so that NbO or an alloy or compound of NbO with other elements are typical examples of such compounds which have electrical properties comparable to a valve metal. Electrode materials of tantalum, aluminium and those electrode materials based on niobium or niobium oxide are preferred. Tantalum and aluminium are very particularly preferred as the electrode material.

For production of the electrode body, often with a porous region, the valve metals can be sintered, for example in powder form, to give a usually porous electrode body, or a porous structure is stamped on a metallic body. The latter can be carried out e.g. by etching a foil.

For simplicity, bodies having a porous region are also called porous in the following. Thus, for example, electrode bodies having a porous region are also called porous electrode bodies. On the one hand, the porous bodies can be permeated by a plurality of channels and therefore be sponge-like. This is often the case if tantalum is used for construction of the capacitor. Furthermore, it is possible for only the surface to have pores and for the region following under the surface pores to be solid in construction. Such a situation is often observed if aluminium is used for construction of the capacitor. Preferably, the electrode body is porous.

The often porous electrode bodies produced in this manner are then oxidized, for example, in a suitable electrolyte, such as e.g. phosphoric acid or an aqueous solution of ammonium adipate, by application of a voltage, in order to form the dielectric. The level of this forming voltage depends on the oxide layer thickness to be achieved or the later use voltage of the capacitor. Preferred forming voltages lie in a range of from 1 to 500 V, particularly preferably in a range of from 2 to 150 V, very particularly preferably in a range of from 3 to 60 V.

The as a rule porous electrode bodies employed preferably have a porosity of from 10 to 90%, preferably from 30 to 80%, particularly preferably from 50 to 80% and an average pore diameter of from 10 to 10,000 nm, preferably from 20 to 5,000 nm, particularly preferably from 50 to 3,000 nm.

According to a particular embodiment of the process according to the invention, the electrolyte capacitor to be produced is an aluminium wound capacitor. In this case, in process step a) a porous aluminium foil is formed anodically as the electrode material, an aluminium oxide coating being formed as the dielectric. The aluminium foil (anode foil) obtained in this manner is then provided with a contact wire and wound up with a further optionally porous aluminium foil (cathode foil) likewise provided with a contact wire, these two foils being spaced from one another by one or more separators, which are based e.g. on cellulose or, preferably, on synthetic papers. After being wound up, the anode bodies obtained in this way are fixed, for example by means of an adhesive tape. The separator or separators can be carbonized by heating in an oven. This method and manner of production of anode bodies for aluminium wound capacitors is adequately known from the prior art and is described, for example, in U.S. Pat. No. 7,497,879 B2.

According to further particular embodiments of the process according to the invention, the electrolyte capacitor to be produced is an aluminium stacked capacitor or a tantalum electrolytic capacitor ("tantalum elco"), in particular a tantalum electrolytic capacitor having a polymeric outer layer, such as is described in DE-A-10 2009 007 594.

In process step b) of the process according to the invention, dispersion comprising a dispersing agent and complexes of polythiophenes and polyanions, wherein the weight ratio of polythiophenes:polyanions in the dispersion is greater than 0.5, is introduced into at least a part of the anode body. It is particularly preferable for the weight ratio of polythiophenes:polyanions in the dispersion to be at least 0.67 and less than 1.5, in particular for it to be at least 0.67 and to be less than 1.0. The weight of the polythiophenes here corresponds to the weight of the thiophene monomers employed for the preparation of the conductive polymers, assuming that complete conversion takes place during the polymerization. If a dispersion comprises, for example, 1 part by weight of polythiophene and 2 parts by weight of polyanions, the weight ratio of polythiophenes:polyanions in the dispersion is 1:2=0.5.

The dispersion is introduced into the porous region by known processes, e.g. impregnation, dipping, pouring, dripping on, spraying, misting on, knife coating, brushing or printing, for example ink-jet, screen or tampon printing. Preferably, the introduction is carried out by dipping the anode body provided in process step a) into the dispersion and thus impregnating it with this dispersion. The dipping into or the impregnation with the dispersion is preferably carried out for a period in a range of from 1 second to 120 minutes, particularly preferably in a range of from 10 seconds to 60 minutes and most preferably in a range of from 30 seconds to 15 minutes. The introduction of the dispersion into the anode body can be facilitated, for example, by increased or reduced pressure, vibration, ultrasound or heat.

The introduction of the dispersion into the anode body can be carried out directly or using an adhesion promoter, for example a silane, such as e.g. organofunctional silanes or hydrolysates thereof, e.g. 3-glycidoxypropyltrialkoxysilane, 3-aminopropyltriethoxysilane, 3-mercaptopropyltrimethoxysilane, 3-methacryloxypropyltrimethoxysilane, vinyltrimethoxysilane or octyltriethoxysilane, and/or one or more other functional layers.

As a result of the introduction, the dispersion preferably covers the pores of the porous region with a layer rather less. Rather, the surfaces of the cavities of the pores are at least partly coated with the dispersion. The particles present in the dispersion thus not only form a layer covering the openings of the pores; at least parts, often also all regions of the surface of the pores are also covered with a layer of the particles of the dispersion.

According to the invention, it is particularly preferable for the polythiophene to be a polythiophene having recurring units of the general formula (i) or (ii) or a combination of units of the general formulae (i) and (ii), very particularly preferably a polythiophene having recurring units of the general formula (ii)

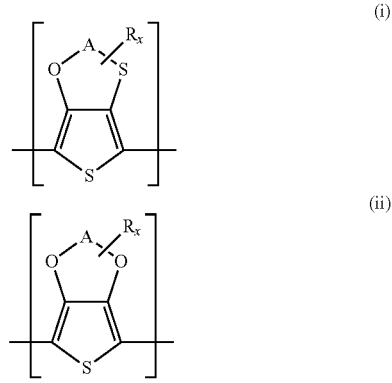

wherein
A represents an optionally substituted $C_1$-$C_5$-alkylene radical,
R represents a linear or branched, optionally substituted $C_1$-$C_{18}$-alkyl radical, an optionally substituted $C_5$-$C_{12}$-cycloalkyl radical, an optionally substituted $C_6$-$C_{14}$-aryl radical, an optionally substituted $C_7$-$C_{18}$-aralkyl radical, an optionally substituted $C_1$-$C_4$-hydroxyalkyl radical or a hydroxyl radical,
x represents an integer from 0 to 8 and
in the case where several radicals R are bonded to A, these can be identical or different.

The general formulae (i) and (ii) are to be understood as meaning that x substituents R can be bonded to the alkylene radical A.

Polythiophenes having recurring units of the general formula (ii) wherein A represents an optionally substituted $C_2$-$C_3$-alkylene radical and x represents 0 or 1 are particularly preferred.

In the context of the invention, the prefix "poly" is to be understood as meaning that the polymer or polythiophene comprises more than one identical or different recurring units of the general formulae (i) and (ii). In addition to the recurring units of the general formulae (i) and/or (ii), the polythiophenes can optionally also comprise other recurring units, but it is preferable for at least 50%, particularly preferably at least 75% and most preferably at least 95% of all recurring units of the polythiophene to have the general formula (i) and/or (ii), preferably the general formula (ii). The percentage figures stated above are intended here to express the numerical content of the units of the structural formula (i) and (ii) in the total number of monomer units in the conductive polymer doped with foreign substance. The polythiophenes comprise a total of n recurring units of the general formula (i) and/or (ii), preferably of the general formula (ii), wherein n is an integer from 2 to 2,000, preferably 2 to 100. The recurring units of the general formula (i) and/or (ii), preferably of the general formula (ii), can in each case be identical or different within a polythiophene. Polythiophenes having in each case identical recurring units of the general formula (ii) are preferred.

According to a very particular embodiment of the process according to the invention, at least 50%, particularly preferably at least 75%, still more preferably at least 95% and most preferably 100% of all the recurring units of the polythiophene are 3,4-ethylenedioxythiophene units (i.e. the most preferred polythiophene is poly(3,4-ethylenedioxythiophene)).

The polythiophenes preferably in each case carry H on the end groups.

In the context of the invention, $C_1$-$C_5$-alkylene radicals A are preferably methylene, ethylene, n-propylene, n-butylene or n-pentylene. $C_1$-$C_{18}$-alkyl radicals R preferably represent linear or branched $C_1$-$C_{18}$-alkyl radicals, such as methyl, ethyl, n- or iso-propyl, n-, iso-, sec- or tert-butyl, n-pentyl, 1-methylbutyl, 2-methylbutyl, 3-methylbutyl, 1-ethylpropyl, 1,1-dimethylpropyl, 1,2-dimethylpropyl, 2,2-dimethylpropyl, n-hexyl, n-heptyl, n-octyl, 2-ethylhexyl, n-nonyl, n-decyl, n-undecyl, n-dodecyl, n-tridecyl, n-tetradecyl, n-hexadecyl or n-octadecyl, $C_5$-$C_{12}$-cycloalkyl radicals R represent, for example, cyclopentyl, cyclohexyl, cycloheptyl, cyclooctyl, cyclononyl or cyclodecyl, $C_5$-$C_{14}$-aryl radicals R represent, for example, phenyl or naphthyl, and $C_7$-$C_{18}$-aralkyl radicals R represent, for example, benzyl, o-, m-, p-Tolyl, 2,3-, 2,4-, 2,5-, 2,6-, 3,4-, 3,5-xylyl or mesityl. The preceding list serves to illustrate the invention by way of example and is not to be considered conclusive.

In the context of the invention, numerous organic groups are possible as optional further substituents of the radicals A and/or of the radicals R, for example alkyl, cycloalkyl, aryl, aralkyl, alkoxy, halogen, ether, thioether, disulphide, sulphoxide, sulphone, sulphonate, amino, aldehyde, keto, carboxylic acid ester, carboxylic acid, carbonate, carboxylate, cyano, alkylsilane and alkoxysilane groups and carboxamide groups.

The polythiophenes are preferably cationic, "cationic" relating only to the charges on the polythiophene main chain. The positive charges are not shown in the formulae, since their precise number and position cannot be determined absolutely. However, the number of positive charges is at least 1 and at most n, where n is the total number of all recurring units (identical or different) within the polythiophene.

To compensate the positive charge, the cationic polythiophenes require anions as counter-ions, the counter-ions being polymeric anions (polyanions). In this context it is particularly preferable for the dispersion to comprise ionic complexes of polythiophenes and polyanions, very particularly preferably ionic complexes of poly(3,4-ethylenedioxythiophene) and polystyrenesulphonic acid (so-called PEDOT/PSS complexes).

Polyanions are preferable to monomeric anions as counter-ions, since they contribute towards film formation and because of their size lead to electrically conductive films which are more stable to heat. Polyanions here can be, for example, anions of polymeric carboxylic acids, such as polyacrylic acids, polymethacrylic acid or polymaleic acids, or of polymeric sulphonic acids, such as polystyrenesulphonic acids and polyvinylsulphonic acids. These polycarboxylic and -sulphonic acids can also be copolymers of vinylcarboxylic and vinylsulphonic acids with other polymerizable monomers, such as acrylic acid esters and styrene. Particularly preferably, the solid electrolyte comprises an anion of a polymeric carboxylic or sulphonic acid for compensation of the positive charge of the polythiophene.

The anion of polystyrenesulphonic acid (PSS), which, if a polythiophene is used, in particular poly(3,4-ethylenedioxythiophene), is preferably present bonded as a complex in the form of the PEDOT/PSS ionic complexes known from the prior art, is particularly preferred as the polyanion. Such ionic complexes are obtainable by polymerizing the thiophene monomers, preferably 3,4-ethylenedioxythiophene, oxidatively in aqueous solution in the presence of polystyrenesulphonic acid. Details of this are to be found, for example, in chapter 9.1.3 in "*PEDOT•Principles and Applications of an Intrinsically Conductive Polymer*", Elschner et al., CRC Press (2011).

The molecular weight of the polyacids which supply the polyanions is preferably 1,000 to 2,000,000, particularly preferably 2,000 to 500,000. The polyacids or their alkali metal salts are commercially obtainable, e.g. polystyrenesulphonic acids and polyacrylic acids, or can be prepared by known processes (see e.g. Houben Weyl, Methoden der organischen Chemie, vol. E 20 Makromolekulare Stoffe, part 2, (1987), p. 1141 et seq.).

The ionic complexes of polythiophenes and polyanions, in particular the PEDOT/PSS ionic complexes, are preferably present in the dispersion in the form of particles. These particles in the dispersion preferably have a specific electrical conductivity of greater than 50 S/cm. In this context, the specific electrical conductivity of the particles is the specific electrical conductivity of the film in the dry state which forms from the particles on drying of the dispersion. Preferably, dispersions in which the particles have a specific electrical conductivity of greater than 100 S/cm, particularly preferably greater than 300 S/cm, where appropriate even greater than 500 S/cm, are employed. In some cases particles having a specific conductivity of a maximum of 5,000 S/cm are also employed.

According to the invention, the particles in the dispersion employed in process step b) preferably have a diameter $d_{50}$ in a range of from 1 to 100 nm, preferably in a range of from 1 to 60 nm and particularly preferably in a range of from 5 to 40 nm. The $d_{50}$ value of the diameter distribution says in this context that 50% of the total weight of all the particles in the dispersion can be assigned to those particles which have a diameter of less than or equal to the $d_{50}$ value. The diameter of the particles is determined via an ultracentrifuge measurement. The general procedure is described in Colloid Polym. Sci. 267, 1113-1116 (1989).

The dispersion employed in process step b) preferably has a purity of metals and transition metals as described in WO 2010/003874 A2 specification on page 6, lines 10-29. The low concentrations of metals in the dispersions have the great advantage that the dielectric is not damaged during formation of the solid electrolyte and in later operation of the capacitor.

The dispersion employed in process step b) comprises one or more dispersing agents in addition to the polythiophene and the polyanions, preferred dispersing agents being water, organic solvents or mixtures of organic solvent and water. Dispersing agents which may be mentioned are, for example, the following solvents: aliphatic alcohols, such as methanol, ethanol, i-propanol and butanol; aliphatic ketones, such as acetone and methyl ethyl ketone; aliphatic carboxylic acid esters, such as ethyl acetate and butyl acetate; aromatic hydrocarbons, such as toluene and xylene; aliphatic hydrocarbons, such as hexane, heptane and cyclohexane; chlorohydrocarbons, such as methylene chloride and dichloroethane; aliphatic nitriles, such as acetonitrile; aliphatic sulphoxides and sulphones, such as dimethylsulphoxide and sulpholane; aliphatic carboxylic acid amides, such as methylacetamide, dimethylacetamide and dimethylformamide; aliphatic and araliphatic ethers, such as diethyl ether and anisole. Water or a mixture of water with the abovementioned organic solvents can furthermore also be used as a dispersing agent.

Preferred dispersing agents are water or other protic solvents, such as alcohols, e.g. methanol, ethanol, i-propanol and butanol, and mixtures of water with these alcohols, water being the particularly preferred dispersing agent.

The dispersion employed in process step b) can moreover comprise further additives in addition to the polythiophene, the polyanions and the dispersing agent, such as surface-active substances, e.g. anionic surfactants, such as e.g. alkylbenzenesulphonic acids and salts, paraffinsulphonates, alcohol sulphonates, ether sulphonates, sulphosuccinates, phosphate esters, alkyl ether carboxylic acids or carboxylates, cationic surfactants, such as e.g. quaternary alkylammonium salts, nonionic surfactants, such as e.g. linear alcohol ethoxylates, oxo alcohol ethoxylates, alkylphenol ethoxylates or alkyl polyglucosides, or adhesion promoters, such as e.g. organofunctional silanes or hydrolysates thereof, e.g. 3-glycidoxypropyltrialkoxysilane, 3-aminopropyltriethoxysilane, 3-mercaptopropyltrimethoxysilane, 3-methacryloxypropyltrimethoxysilane, vinyltrimethoxysilane or octyltriethoxysilane, crosslinking agents, such as melamine compounds, masked isocyanates, functional silanes—e.g. tetraethoxysilane, alkoxysilane hydrolysates, e.g. based on tetraethoxysilane, epoxysilanes, such as 3-glycidoxypropyltrialkoxysilane—polyurethanes, polyacrylates or polyolefin dispersions.

Preferably, the dispersions employed in process step b) comprise further additives which optionally increase the conductivity, such as e.g. compounds containing ether groups, such as e.g. tetrahydrofuran, compounds containing lactone groups, such as γ-butyrolactone, γ-valerolactone, compounds containing amide or lactam groups, such as caprolactam, N-methylcaprolactam, N,N-dimethylacetamide, N-methylacetamide, N,N-dimethylformamide (DMF), N-methylformamide, N-methylformanilide, N-methylpyrrolidone (NMP), N-octylpyrrolidone, pyrrolidone, sulphones and sulphoxides, such as e.g. sulpholane (tetramethylene sulphone), dimethylsulphoxide (DMSO), sugars or sugar derivatives, such as e.g. sucrose, glucose, fructose, lactose, sugar alcohols, such as e.g. sorbitol, mannitol, furan derivatives, such as e.g. 2-furancarboxylic acid, 3-furancarboxylic acid, glycerol, diglycerol, triglycerol or tetraglycerol.

The dispersion can also comprise as additives alkylene glycols, dialkylene glycols, trialkylene glycols, polyalkylene glycols from more than three alkylene units, polyglycerols or mixtures of at least two of these compounds. In this connection it is particularly preferable for the dispersion to comprise at least an alkylene glycol, a polyalkylene glycol, a polyglycerol or a mixture of at least two of these additives.

Ethylene glycol and propylene glycol are preferred in particular as the alkylene glycol. Preferred dialkylene glycols, trialkylene glycols or polyalkylene glycols are in particular those based on ethylene glycols and propylene glycols or random copolymers of the two. Diethylene glycol, dipropylene glycol, triethylene glycol, tripropylene glycol, polyethylene glycol or polypropylene glycol are preferred in particular. The polyalkylene glycols can also be branched. The polyalkylene glycols can furthermore be unsubstituted on the end groups, i.e. carry two free hydroxyl groups, or functionalized once or twice on the end groups. The polyalkylene glycol or polyalkylene glycol derivative preferably has a molecular weight, determined by gel permeation chromatography, in a range of from 100 to 100,000 g/mol, particularly preferably in a range of from 200 to 50,000 g/mol and most preferably in a range of from 200 to 5,000. Polyethylene glycols are particularly preferred as the polyalkylene glycols. Possible compounds are, in particular, the polyethylene glycols known under the names "PEG 300", "PEG 400", "PEG 600", "PEG 1000", "PEG 2000" or "PEG 4000". "PEG 400" and "PEG 600" are particularly preferred.

Preferred polyglycerols which can be employed as additives are those polyglycerols which are disclosed in DE-A-10 2011 013 068. Polyglycerols which comprise diglycerol, triglycerol, tetraglycerol, pentaglycerol, hexaglycerol and optionally oligomers of more than six glycerol units are preferred in particular. Such polyglycerols are obtainable, for example, from SOLVAY CHEMICALS GmbH, Rheinberg, Germany under the names "Polyglycerol-3" (contains about 29 wt. % of diglycerol, about 42 wt. % of triglycerol, about 19 wt. % of tetraglycerol, about 6 wt. % of pentaglycerol and about 4 wt. % of polyglycerols of six or more glycerol units) or "Polyglycerol-4" (contains about 2 wt. % of diglycerol, about 40 wt. % of triglycerol, about 35 wt. % of tetraglycerol, about 20 wt. % of pentaglycerol and about 8 wt. % of polyglycerols of six or more glycerol units).

If alkylene glycols, polyalkylene glycols and/or polyglycerols are used in particular as additives, these substances can also be introduced into at least a part of the anode body only after the introduction of the dispersion into at least a part of the anode body in process step b) and the at least partial removal of the dispersing agent. This can be realized, for example, by impregnating the anode body with a solution or dispersion comprising the alkylene glycols, the polyalkylene glycols and/or the polyglycerols.

In this connection it is furthermore preferable for the dispersion employed in process step b) to comprise the alkylene glycol, the polyalkylene glycol, the polyglycerol or the mixture of at least two of these in an amount in a range of from 0.1 to 40 wt. %, particularly preferably in a range of from 1 to 30 wt. % and most preferably from 2 to 20 wt. %, in each case based on the total weight of the dispersion employed in process step b).

The dispersions employed in process step b) can moreover comprise as an additive one or more organic binders which are soluble in organic solvents, as described in WO 2009/141209 A1 on page 12, lines 16-34. The dispersions can have a pH of from 1 to 14, and a pH of from 1 to 8 is preferred. For corrosion-sensitive dielectrics, such as, for example, aluminium oxides or niobium oxides, dispersions having a pH of from 2.5 to 8 are preferred, in order not to damage the dielectric.

To adjust the pH, for example, bases or acids, as described in WO 2010/003874 A2 on page 4, lines 13-32, can be added as additives to the dispersions employed in process step b). Those additions which do not impair the film formation of the dispersions and are not volatile at higher temperatures, e.g. soldering temperatures, but remain in the solid electrolyte under these conditions, such as e.g. the bases 2-dimethylaminoethanol, 2,2'-iminodiethanol or 2,2',2''-nitrilotriethanol and the acid polystyrenesulphonic acid, are preferred.

The viscosity of the dispersion employed in process step b) can be between 0.1 and 1,000 mPa·s (measured with a rheometer at 20° C. and a shear rate of 100 s$^1$), depending on the method of application. Preferably, the viscosity is 1 to 500 mPa·s, particularly preferably between 5 to 250 mPa·s. In the case of the production of aluminium wound capacitors the viscosity is very particularly preferably in a range of from 40 to 200 mPa·s, while in the production of tantalum electrolytic capacitors or aluminium stacked capacitors it is very particularly preferably in a range of from 5 to 50 mPa·s.

The solids content of the dispersion employed in process step b) is preferably in a range of from 0.01 to 20 wt. %, particularly preferably in a range of from 0.1 to 10 wt. % and most preferably in a range of from 0.25 to 5 wt. %, in each case based on the total weight of the dispersion. The solids content of PEDOT/PSS (without additives) is determined via drying of the dispersion at a temperature which is sufficiently high to remove the dispersing agent, but without thereby decomposing the solid.

After the anode bodies have been impregnated with the dispersion described above, in process step c) the dispersing agent contained in the dispersion is at least partly removed or hardened, so that a solid electrolyte which completely or partly covers the dielectric, and therefore a capacitor body is formed. In this context it is preferable for the covering of the dielectric by the solid electrolyte to be preferably at least 50%, particularly preferably at least 70% and most preferably at least 80%, it being possible for the covering to be determined by measurement of the capacitance of the capacitor in the dry and in the damp state at 120 Hz, as is described in DE-A-10 2005 043 828.

The removal or hardening is preferably carried out by removing the electrode body from the dispersion and drying it, the drying preferably being carried out at a temperature in a range of from 20° C. to 260° C., particularly preferably in a range of from 50° C. to 220° C. and most preferably in a range of from 80° C. to 200° C. Process steps b) and c) can also be repeated once or several times, in order in this manner to adapt the thickness of the layer of the solid electrolyte deposited on the dielectric or the degree of filling of the electrolyte in the electrode body to the particular requirements.

After the capacitor bodies have been produced in this manner, they can be further modified by the method and manner known to the person skilled in the art. In the case of a tantalum electrolytic capacitor, the capacitor bodies can be covered, for example, with a polymeric outer layer, as is described in DE-A-10 2004 022674 or DE-A-10 2009 007 594, and/or a graphite layer and a silver layer, as is known from DE-A-10 2005 043 828, while in the case of an aluminium wound capacitor, in accordance with the teaching of U.S. Pat. No. 7,497,879 B2, the capacitor body is incorporated into an aluminium beaker, provided with a sealing inspection glass and firmly closed mechanically by crimping. The capacitor can then be freed from defects in the dielectric in a known manner by aging.

A contribution towards achieving the abovementioned objects is also made by a capacitor which is obtainable, preferably has been obtained, by the process according to the invention. Preferably, this capacitor is a tantalum electrolytic capacitor or an aluminium capacitor, for example an aluminium stacked capacitor or an aluminium wound capacitor.

A contribution towards achieving the abovementioned objects is also made by a capacitor comprising an electrode body of an electrode material, wherein a dielectric at least partly covers the surface of this electrode material and forms an anode body, wherein the anode body is at least partly coated with a solid electrolyte which comprises polythiophenes and polyanions, wherein the weight ratio of polythiophenes:polyanions in the solid electrolyte is greater than 0.5. It is particularly preferable for the weight ratio of polythiophenes:polyanions in the solid electrolyte to be at least 0.67 and less than 1.5, in particular for it to be at least 0.67 and less than 1.0.

Such a capacitor is obtainable, for example, by the process according to the invention described above. Preferred polythiophenes and polyanions in this context are those polythiophenes and polyanions which have already been mentioned above as preferred polythiophenes and polyanions in connection with the process according to the invention.

A further contribution towards achieving the abovementioned objects is also made by an electronic circuit comprising a capacitor obtainable by the process according to the invention or a capacitor according to the invention. In this connection there are to be mentioned, for example, electronic circuits such as can be found, for example, in computers (desktop, laptop, server), in computer peripherals (e.g. PC cards), in portable electronic equipment, such as e.g. mobile telephones, digital cameras or electronic entertainment systems, in devices for electronic entertainment systems, such as e.g. in CD/DVD players and computer games consoles, in navigation systems, in telecommunications installations, in domestic appliances, in medical technology, e.g. for defibrillators. According to the invention, the capacitors can also be employed in electronic circuits in hybrid or electric propulsion means for an automobile. The capacitors can serve in particular as intermediate capacitors (DC link capacitors) here.

A contribution towards achieving the abovementioned objects is also made by the use of a capacitor obtainable by the process according to the invention or of a capacitor according to the invention in electronic circuits, for example as an intermediate capacitor in an electronic circuit in hybrid or electric propulsion means for an automobile.

A contribution towards achieving the abovementioned objects is also made by a process for the preparation of a dispersion comprising a dispersing agent and complexes of polythiophenes and polyanions, comprising the process step of oxidative polymerization of thiophene monomers in the presence of the polyanions in a liquid reaction phase comprising the dispersing agent, wherein the thiophene monomers and the polyanions are employed in a relative amount such that the weight ratio of polythiophenes:polyanions in the dispersion is greater than 0.5. It is particularly preferable for the weight ratio of thiophene monomers:polyanions in the liquid reaction phase to be at least 0.67 and less than 1.5, in particular for it to be at least 0.67 and less than 1.0.

Preferred polythiophenes and polyanions in this context are those polythiophenes and polyanions which have already been mentioned above as preferred polythiophenes and polyanions in connection with the process according to the invention. Very particularly preferably, the thiophene monomer is 3,4-ethylenedioxythiophene and the polyanion is polystyrenesulphonic acid.

According to a particular embodiment of the process according to the invention for the preparation of a dispersion, it is furthermore preferable for the oxidative polymerization of the thiophene monomers to be carried out in the presence of the polyanions in water as the dispersing agent and in the presence of a compound of the general formula (I)

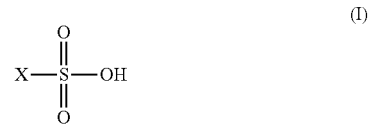

in which X represents an OH group, an aliphatic or aromatic $C_1$-$C_{10}$-alkyl radical or an aliphatic or aromatic $C_1$-$C_{10}$-alkoxy radical (—OR), wherein the concentration of the compound of the general formula (I) in the aqueous reaction phase is preferably in a range of from 0.01 to 5 wt. %, particularly preferably in a range of from 0.05 to 2.5 wt. % and most preferably in a range of from 0.1 to 1 wt. %, in each case based on the total weight of the aqueous phase. Preferably, the compound of the general formula (I) has a molecular weight of less than 250 g/mol, still more preferably of less than 100 g/mol, the use of sulphuric acid as the compound of the general formula (I) being most preferred.

A contribution towards achieving the abovementioned objects is also made by a dispersion which is obtainable by the process described above.

A contribution towards achieving the abovementioned objects is moreover made by a process for the production of an organic solar cell, comprising
A) a substrate layer;
B) a transparent anode layer;
C) a semiconductor layer;
D) a cathode layer, preferably a cathode layer of aluminium;
   wherein by coating with a dispersion comprising a dispersing agent and complexes of polythiophenes and polyanions, wherein the weight ratio of polythiophenes:polyanions in the dispersion is greater than 0.5, and subsequent removal of the dispersing agent, or by coating with a dispersion obtainable by the process according to the invention for the preparation of a dispersion and subsequent removal of the dispersing agent,
i) a layer which comprises complexes of polythiophenes and polyanions is applied to the substrate layer,
ii) a layer which comprises complexes of polythiophenes and polyanions is applied as an outer layer to the semiconductor layer, or
iii) a layer which comprises complexes of polythiophenes and polyanions is applied between the transparent anode layer and the semiconductor layer.

The solar cell produced by the process according to the invention comprising A) a substrate layer, B) a transparent anode layer, C) a semiconductor layer and D) a cathode layer, wherein the sequence of this layer can vary, depending on the nature of the solar cell. Fundamental layer sequences are to be found in particular in chapter 10.7 in "*PEDOT•Principles and Applications of an Intrinsically Conductive Polymer*", Elschner et al., CRC Press (2011) and chapter 2 in the dissertation "*Zur Funktionsweise organischer Solarzellen auf der Basis interpenetrierender Donator/Akzeptor-Netzwerke*" (2007) by Markus Glatthaar.

The substrate layer A) is preferably a layer of glass or plastic, while the semiconductor layer C), for example, comprises a layer comprising poly(3-hexylthiophene) (P3HT) as the donor and substituted fullerenes, such as [6,6]-phenyl-C61-butyric acid methyl ester (PCBM), as the acceptor. The transparent anode layer B) can be, for example, a layer of indium tin oxide (ITO) or also can be based on ionic complexes of polythiophenes and polyanions, in particular on PEDOT/PSS (see process alternative i)).

According to the invention, it is very particularly preferable for the solar cell produced by the process according to the invention to be a solar cell of so-called "inverted structure". Such a solar cell comprising a substrate layer A) (which is preferably a layer of glass or plastic), followed by a cathode layer D), which is preferably a cathode layer of aluminium, optionally followed by a layer of titanium or of zinc oxide, followed by a semiconductor layer C) (which is preferably a layer comprising P3HT and PCBM) and followed by a transparent anode layer B).

The process according to the invention for the production of an organic solar cell is thus characterized in that by coating with a dispersion comprising a dispersing agent and complexes of polythiophenes and polyanions, wherein the weight ratio of polythiophenes:polyanions in the dispersion is greater than 0.5, and subsequent removal of the dispersing agent, or by coating with a dispersion obtainable by the process according to the invention for the preparation of a dispersion and subsequent removal of the dispersing agent,
i) a layer which comprises complexes of polythiophenes and polyanions is applied to the substrate layer,
ii) a layer which comprises complexes of polythiophenes and polyanions is applied as an outer layer to the semiconductor layer, or
iii) a layer which comprises complexes of polythiophenes and polyanions is applied between the transparent anode layer and the semiconductor layer.

The application of the dispersion to the particular layers can be carried out, for example, by known processes, e.g. by spin coating, impregnation, pouring, dripping on, spraying, misting, knife coating, brushing or printing, for example ink-jet, screen, gravure, offset or tampon printing, in a wet film thickness of from 0.5 µm to 250 µm, preferably in a wet film thickness of from 2 µm to 50 µm. The at least partial removal of the dispersing agent is preferably carried out by drying at a temperature in a range of from 20° C. to 220° C., it possibly being advantageous to at least partially remove the supernatant dispersion from the substrate before the drying process, for example by spinning off.

A contribution towards achieving the abovementioned object is also made by an organic solar cell which is obtainable by the process according to the invention for the production of an organic solar cell.

A contribution towards achieving the abovementioned objects is also made by the use of a dispersion comprising a dispersing agent and complexes of polythiophenes and polyanions, wherein the weight ratio of polythiophenes:polyanions in the dispersion is greater than 0.5, or of a dispersion which is obtainable by the process according to the invention for the preparation of a dispersion, for the production of a transparent conductive layer in an organic solar cell, in particular in an organic solar cell of inverted structure.

The invention is now explained in more detail with the aid of non-limiting figures and examples.

FIG. 1 is a diagram of a section through a part of a capacitor obtainable by the process according to the invention for the production of a capacitor. This has an electrode body 1, usually made of a porous electrode material 2, such as aluminium. On the surface 4 of the electrode material 2, a dielectric 3 is formed as a thin layer, so that an anode body 5 which is still porous and comprises the electrode body 1 of the electrode material 2 and the dielectric 3 is formed. The dielectric 3 is followed, optionally after further layers, by a layer of a solid electrolyte 6 (e.g. comprising PEDOT/PSS particles), whereby a capacitor body 7 comprising the electrode body 1 of the electrode material 2, the dielectric 3 and the solid electrolyte 6 is formed.

Figure 2:
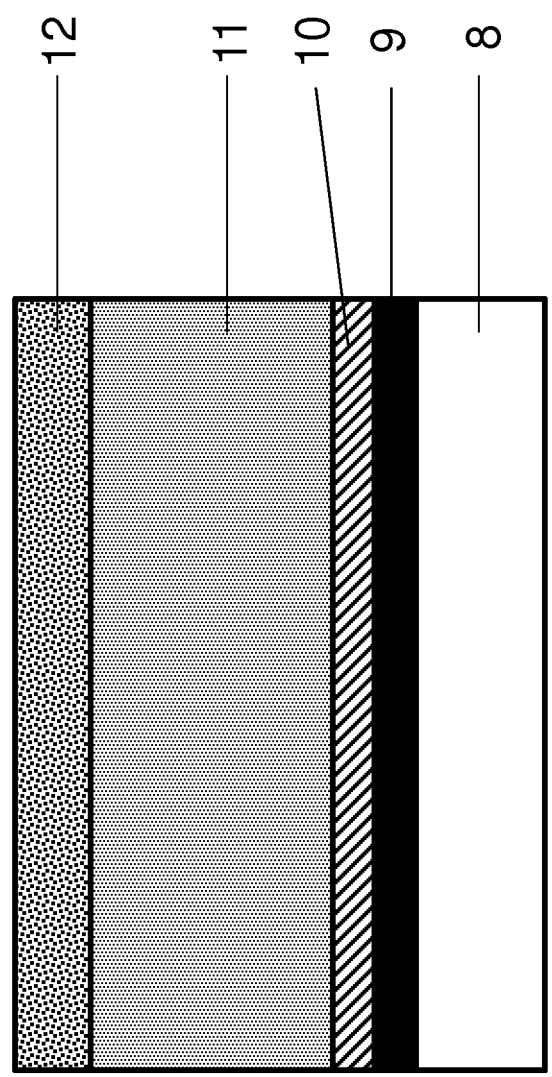
FIG. 2 shows a diagram of the layer sequence of a solar cell of inverted structure which is obtainable in accordance with one or more embodiments of the invention.

FIG. 2 shows a diagram of the layer sequence of a solar cell of inverted structure which is obtainable by the process according to the invention for the production of an organic solar cell. It comprises a glass substrate 8, on to which a cathode layer 9 of e.g. aluminium, silver or ITO about 100 nm thick is applied. The cathode layer 9 is followed by a further layer 10 for improving the electron extraction, such as e.g. a titanium oxide or a zinc oxide layer in a thickness of from 5 nm to 200 nm. On this is found the active semiconductor layer 11, for example P3HT and PCBM having a thickness of from about 80 to 250 nm. On to this semiconductor layer, starting from a dispersion according to the invention or a dispersion obtainable by the process according to the invention for the preparation of a dispersion, a transparent anode layer 12 is applied, which after drying has a thickness of from 5 nm to 250 nm. A metallic strip mesh, for example of gold or copper (not shown), can then be applied to this outer layer.

Measurement Methods

Equivalent Series Resistance

The equivalent series resistance (in mΩ) was determined at 20° C. at 100 kHz by means of an LCR meter (Agilent 4284A).

Capacitance

The capacitance (in g) was determined at 20° C. at 120 Hz by means of an LCR meter (Agilent 4284A)

EXAMPLES

Comparative Example 1

Preparation of a 1:2.5 Dispersion (PEDOT:PSS=0.4)

A 3 l high-grade steel tank was equipped with a stirrer, a ventilating valve on the upper lid, a closeable material inlet on the upper lid, a ventilating valve on the base and a temperature control jacket connected to a thermostat. 2,450 g of water, 11.4 g of sulphuric acid (95% strength), 107.6 g of polystyrenesulphonic acid solution (25% strength) and 5.7 g of a 10% strength iron(III) sulphate solution were introduced into the reaction vessel. The stirrer rotated at 50 revolutions/minute (rpm). The temperature was adjusted to 45° C. and the internal pressure in the tank was lowered to 100 hPa. The temperature was lowered to 13° C. over 16 h. As a result, the internal pressure was reduced to 33 hPa. 10.77 g of ethylenedioxythiophene (Clevios™ M V2, Heraeus Precious Metals GmbH & Co. KG, Hanau) were then sucked in via a tube in countercurrent with nitrogen. 21.2 g of sodium peroxodisulphate were dissolved in 100 g of water and likewise sucked into the reaction medium via the tube. The material inlet was closed and the internal pressure of the reaction vessel was adjusted to 25 hPa with the aid of a vacuum pump. The reaction was now carried out under this reduced pressure for 22 h. After the reaction had ended, the reaction vessel was ventilated and the mixture was transferred into a plastic beaker, and for removal of inorganic salts 400 g of a cation exchanger (Lewatit S108H, Lanxess AG) and 340 ml of an anion exchanger (Lewatit MP 62, Lanxess AG) were added. The mixture was stirred for 6 h and the ion exchanger was filtered off. Finally, the mixture passed over a 10 µm filter. The dispersion obtained has a viscosity of 415 mPas at a shear rate of 100 s$^{-1}$. The solids content, determined gravimetrically, was 1.14%.

Determination of the Conductivity (Method 1):

1 g of dimethylsulphoxide was added to 19 g of this dispersion. A cleaned glass substrate was laid on a lacquer whirler coater and 10 ml of the abovementioned mixture were distributed on the substrate. The substrate coated in this way was then dried on a hot-plate at 130° C. for 15 min. The layer thickness was 157 nm (Dektak 150, Veeco).

The conductivity was determined by vapour deposition of Ag electrodes of 2.5 cm length at a distance of 10 mm via a shadow mask. The surface resistance determined with an electrometer (Keithly 614) was multiplied by the layer thickness in order to obtain the specific electrical resistance. The specific resistance of the layer was 0.00112 Ohm×cm. This corresponds to a conductivity of 824 S/cm. The layers produced in this way are clear.

Homogenization

This dispersion was then homogenized with a high pressure homogenizer five times under a pressure of 1,500 bar. The dispersion was subsequently concentrated to a solids content of 2.4% and homogenized again five times under a pressure of 1,500 bar. The dispersion was then filtered over a 0.2 μm absolute filter. The dispersion obtained has a viscosity of 93 mPas at a shear rate of 100 s$^{-1}$. The solids content, determined gravimetrically, was 2.12%. The conductivity determined by method 1 was 752 S/cm.

Example 1 (According to the Invention)

Preparation of the 1:1.5 Dispersion (PEDOT:PSS=0.67)

A 3 l high-grade steel tank was equipped with a stirrer, a ventilating valve on the upper lid, a closeable material inlet on the upper lid, a ventilating valve on the base and a temperature control jacket connected to a thermostat. 2,450 g of water, 11.4 g of sulphuric acid (95% strength), 64.6 g of polystyrenesulphonic acid solution (25% strength) and 5.7 g of a 10% strength iron(III) sulphate solution were introduced into the reaction vessel. The stirrer rotated at 50 revolutions/minute (rpm). The temperature was adjusted to 45° C. and the internal pressure in the tank was lowered to 100 hPa. The temperature was lowered to 13° C. over 16 h. As a result, the internal pressure was reduced to 33 hPa. 10.77 g of ethylenedioxythiophene (Clevios™ M V2, Heraeus Precious Metals GmbH & Co. KG, Hanau) were then sucked in via a tube in countercurrent with nitrogen. 21.2 g of sodium peroxodisulphate were dissolved in 100 g of water and likewise sucked into the reaction medium via the tube. The material inlet was closed and the internal pressure of the reaction vessel was adjusted to 25 hPa with the aid of a vacuum pump. The reaction was now carried out under this reduced pressure for 22 h. After the reaction had ended, the reaction vessel was ventilated and the mixture was transferred into a beaker of plastic, and for removal of inorganic salts 400 g of a cation exchanger (Lewatit S108H, Lanxess AG) and 340 ml of an anion exchanger (Lewatit MP 62, Lanxess AG) were added. The mixture was stirred for 6 h and the ion exchanger was filtered off. Finally, the mixture passed over a 10 μm filter. The dispersion obtained has a viscosity of 313 mPas at a shear rate of 100 s$^{-1}$. The solids content, determined gravimetrically, was 0.9%.

The conductivity determined by method 1 was 656 S/cm.

This dispersion was then homogenized with a high pressure homogenizer five times under a pressure of 1,500 bar. The dispersion was subsequently concentrated to a solids content of 2.4% and homogenized again five times under a pressure of 1,500 bar. The material was then filtered over a 0.3 μm deep-bed filter. After the filtration, the dispersion had a viscosity of 344 mPas at a shear rate of 100 s$^{-1}$. The solids content, determined gravimetrically, was 2.31%. The conductivity determined by method 1 was 633 S/cm.

The dispersion was diluted to a concentration of 2.12% by addition of deionized water.

Example 2 (According to the Invention)

Preparation of the 1:1 Dispersion (PEDOT:PSS=1)

A 3 l high-grade steel tank was equipped with a stirrer, a ventilating valve on the upper lid, a closeable material inlet on the upper lid, a ventilating valve on the base and a temperature control jacket connected to a thermostat. 2,450 g of water, 11.4 g of sulphuric acid (95% strength), 43.3 g of polystyrenesulphonic acid solution (25% strength) and 5.7 g of a 10% strength iron(III) sulphate solution were introduced into the reaction vessel. The stirrer rotated at 50 revolutions/minute (rpm). The temperature was adjusted to 45° C. and the internal pressure in the tank was lowered to 100 hPa. The temperature was lowered to 13° C. over 16 h. As a result, the internal pressure was reduced to 33 hPa. 10.77 g of ethylenedioxythiophene (Clevios™ M V2, Heraeus Precious Metals GmbH & Co. KG, Hanau) were then sucked in via a tube in countercurrent with nitrogen. 21.2 g of sodium peroxodisulphate were dissolved in 100 g of water and likewise sucked into the reaction medium via the tube. The material inlet was closed and the internal pressure of the reaction vessel was adjusted to 25 hPa with the aid of a vacuum pump. The reaction was now carried out under this reduced pressure for 22 h. After the reaction had ended, the reaction vessel was ventilated and the mixture was transferred into a beaker of plastic, and for removal of inorganic salts 400 g of a cation exchanger (Lewatit S108H, Lanxess AG) and 340 ml of an anion exchanger (Lewatit MP 62, Lanxess AG) were added. The mixture was stirred for 6 h and the ion exchanger was filtered off. Finally, the mixture passed over a 10 μm filter. The dispersion obtained has a viscosity of 54 mPas at a shear rate of 100 s$^{-1}$. The solids content, determined gravimetrically, was 0.89%.

The conductivity determined by method 1 was 411 S/cm.

The dispersion was then homogenized with a high pressure homogenizer five times under a pressure of 1,500 bar. The dispersion was subsequently concentrated to a solids content of 2.4% and homogenized again five times under a pressure of 1,500 bar. The material was then filtered over a 0.3 μm deep-bed filter. The dispersion obtained has a viscosity of 154 mPas at a shear rate of 100 s$^{-1}$. The solids content, determined gravimetrically, was 2.06%.

The conductivity determined by method 1 was 432 S/cm.

Comparative Example 2

The dispersion from Comparative Example 1 was adjusted to a pH of 3 by addition of aqueous ammonia. 90 g of this dispersion were stirred with 10 g of ethylene glycol.

Example 3

The dispersion from Example 1 was adjusted to a pH of 3 by addition of aqueous ammonia. 90 g of this dispersion were stirred with 10 g of ethylene glycol.

Example 4

The dispersion from Example 2 was adjusted to a pH of 3 by addition of aqueous ammonia. 90 g of this dispersion were stirred with 10 g of ethylene glycol.

Preparation Example 1

Production of capacitor bodies for an aluminium wound capacitor:

A porous aluminium foil, formed at 214 V, having dimensions of 131 mm×5 mm (anode foil) and a porous aluminium foil having dimensions of 145 mm×5 mm (cathode foil) were each provided with a contact wire and were then wound up together with two cellulose separator papers and fixed with an adhesive tape. 20 of these oxidized electrode bodies were produced. The separator paper of the oxidized electrode bodies was then carbonized in an oven at 300° C.

Comparative Example 3 (Referred to as "VB3")

The oxidized electrode bodies from Preparation Example 1 were impregnated in the dispersion from Comparative Example 2 in vacuo under 50 mbar for 5 min. Thereafter, drying was carried out at 120° C. for 20 min and then at 150° C. for 20 min. The impregnation and drying were carried out again. The mean electrical values are shown in Table 1.

Example 5 (Referred to as "B5")

The oxidized electrode bodies from Preparation Example 1 were impregnated in the dispersion from Example 3 in vacuo under 50 mbar for 5 min. Thereafter, drying was carried out at 120° C. for 20 min and then at 150° C. for 20 min. The impregnation and drying were carried out again. The mean electrical values are shown in Table 1.

Example 6 (Referred to as "B6")

The oxidized electrode bodies from Production Example 1 were impregnated in the dispersion from Example 4 in vacuo under 50 mbar for 5 min. Thereafter, drying was carried out at 120° C. for 20 min and then at 150° C. for 20 min. The impregnation and drying were carried out again. The mean electrical values are shown in Table 1.

TABLE 1

|  | CAP [μF] | ESR [mΩ] | ΔCAP@−40° C. [%] |
|---|---|---|---|
| VB3 | 16.3 | 27.0 | 9.6 |
| B5 | 17.5 | 18.8 | 6.6 |
| B6 | 16.4 | 13.8 | 5.7 |

Preparation Example 2 (Preparation of a PEDOT/PSS Dispersion for a Polymeric Outer Layer)

1,736 g of deionized water and 660 g of an aqueous polystyrenesulphonic acid solution having an average molecular weight of 70,000 g/mol and a solids content of 3.8 wt. % were initially introduced into a 5 l glass reactor with a stirrer and thermometer. The reaction temperature was kept between 20 and 25° C. 10.2 g of 3,4-ethylenedioxythiophene were added, while stirring. The solution was stirred for 30 minutes. 0.06 g of iron(III) sulphate and 19 g of sodium persulphate were then added and the solution was stirred for a further 24 hours. After the reaction had ended, for removal of inorganic salts 200 ml of a strongly acid cation exchanger and 500 ml of a weakly basic anion exchanger were added and the solution was stirred for a further 2 h. The ion exchanger was filtered off. The dispersion obtained achieved a solids content of 1.5% by subsequent concentration.

160 g of this dispersion, 28 g of water, 6 g of a sulphopolyester (Eastek 1100, solids content 30% average molecular weight 10,000-15,000, Eastman), 8 g of dimethylsulphoxide, 1 g of 3-glycidoxypropyltrimethoxysilane (Silquest A-187, OSi Specialties) and 0.4 g of wetting agent (Dynol 604, Air Products) were mixed intensively in a glass beaker with a stirrer.

(Preparation Example 3) Preparation of a Crosslinking Agent Solution 4.0 g of para-toluenesulphonic acid monohydrate, 1.7 g of 1,10-diaminodecane and 95.5 g of water were mixed intensively in a glass beaker with a stirrer.

(Preparation Example 4) Production of an Electrode Body for a Tantalum Electrolytic Capacitor Tantalum powder having a specific capacitance of 18,000 μFV/g was pressed to pellets with inclusion of a tantalum wire and sintered in order to form a porous anode body having dimensions of 1.5 mm×2.9 mm×4.0 mm. 5 of these porous anode bodies were anodized in a phosphoric acid electrolyte at 100 V to form a dielectric, in order to obtain the capacitor bodies.

Comparative Example 4

The dispersion from Comparative Example 1 was diluted to a concentration of 1.04% by addition of deionized water. 96 g of this dispersion were stirred with 4 g of dimethylsulphoxide (DMSO).

Example 7

The dispersion from Example 1 was diluted to a concentration of 1.04% by addition of deionized water. 96 g of this dispersion were stirred with 4 g of dimethylsulphoxide (DMSO).

Example 8

The dispersion from Example 2 was diluted to a concentration of 1.04% by addition of deionized water. 96 g of this dispersion were stirred with 4 g of dimethylsulphoxide (DMSO).

Comparative Example 5 (Production of a Solid Electrolyte Layer which is not According to the Invention) (Referred to as "VB5")

The capacitor bodies from Preparation Example 4 were impregnated in the dispersion from Comparative Example 4 for 1 min. Thereafter, drying was carried out at 120° C. for 10 min. The impregnation and drying were carried out nine further times.

The capacitor bodies were then impregnated in the solution from Preparation Example 3. Thereafter, drying was carried out at 120° C. for 10 min. The capacitor body was then impregnated in the dispersion from Preparation Example 2. Thereafter, drying was carried out at 120° C. for 10 min.

The capacitor bodies were then impregnated in the solution from Preparation Example 3. Thereafter, drying was carried out at 120° C. for 10 min. The capacitor body was then impregnated in the dispersion from Preparation Example 2. Thereafter, drying was carried out at 120° C. for 10 min.

The capacitor bodies were then impregnated in the solution from Preparation Example 3. Thereafter, drying was carried out at 120° C. for 10 min. The capacitor body was then impregnated in the dispersion from Preparation Example 2. Thereafter, drying was carried out at 120° C. for 10 min.

The capacitor body was then covered with a graphite layer and thereafter with a silver layer in order to obtain the finished capacitors in this way.

Example 9 (Production of a Solid Electrolyte Layer According to the Invention) (Referred to as "B9")

The treatment of the capacitor bodies was carried out as described in Comparative Example 5, but the dispersion from Example 7 was used instead of the dispersion from Comparative Example 4.

Example 10 (Production of a Solid Electrolyte Layer According to the Invention) (Referred to as "B10")

The treatment of the capacitor bodies was carried out as described in Comparative Example 5, but the dispersion from Example 8 was used instead of the dispersion from Comparative Example 4.

TABLE 2

|  | CAP [µF] | ESR [mΩ] |
|---|---|---|
| VB5 | 16.1 | 58.70 |
| B9 | 17.1 | 46.6 |
| B10 | 17.8 | 54.4 |

Example 11 (Production of Organic Solar Cells)

The PEDOT/PSS dispersions according to the invention of high PEDOT content are used for construction of inverted organic solar cells (OSC). The procedure for the production of the OSCs is as follows:

1. Preparation of the ITO-Coated Substrate

ITO-coated glass (Merck Balzers AG, FL, part no. 253 674 XO) is cut into pieces 50 mm×50 mm in size (substrates). The substrates are then cleaned in 3% strength Mucasol solution in an ultrasound bath for 15 min. Thereafter, the substrates are rinsed with distilled water and spin-dried in a centrifuge. Immediately before coating, the ITO-coated sides are cleaned for 10 min in a UV/ozone reactor (PR-100, UVP Inc., Cambridge, GB).

2. Application of the Electron-Extracting Layer 0.75 mol/l of zinc acetate together with 0.75 mol/l of monoethanolamine are dissolved in 2-methoxyethanol. 5 ml of the solution are passed over a 0.45 µm PVDF spray filter and applied to the ITO-coated substrate. The supernatant solution is then spun off with a lacquer spin coater (Karl Süss, RC8) at 2,000 rpm for 30 sec with the lid open and then dried on a hot-plate at 130° C. for 15 min. The film is homogeneous and clear and has a thickness of 25 nm (Dektak 150, Veeco).

3. Application of the Active Semiconductor Layer

Equal amounts by weight of poly(3-hexylthiophene) (P3HT, Sepiolid P 200, BASF) and the substance [6,6]-phenyl-C61-butyric acid methylmethyl ester-1-[3-(methoxy-carbonyl)propyl]-1-phenyl-[6.6]C61-3'H-cyclopropa[1,9][5,6]-fullerene-C60-Ih-3'-butanoic acid 3'-phenylmethyl ester (PCBM, Solenne B.V.) are stirred in dichlorobenzene on a hot-plate at approx. 50° C. overnight in order to dissolve all the material completely. The 1.5% strength solution is then filtered in the hot state over a syringe filter (Millipore HV, 0.45 µm) and then distributed on the electron-extracting layer. The supernatant solution is removed by rotating the plate at 500 rpm over a period of 90 s. Thereafter, the substrate coated in this way is dried on a hot-plate at 130° C. for 15 min. All these steps are carried out in a glove box (MBraun, Labmaster 130) filled with nitrogen. The total layer thickness of the two layers is 125 nm.

4. Application of the Hole-Extracting Layer

In each case 5 ml of PEDOT/PSS dispersion, in each case comprising 0.1 wt. % of the surfactant Dynol 604 and 0.1 wt. % of isopropyl alcohol (pH of the dispersion: 2.0), having various PEDOT:PSS weight ratios are passed over a 0.45 µm PVDF syringe filter and distributed over the active semiconductor layer. The supernatant solution is then removed by rotating the plate. The speed of rotation and the rotation time depend on the desired final layer thickness, and the solids content and the viscosity of the solution investigated. A layer thickness of approx. 50 nm was aimed for if possible. As Table 3 shows, the wetting properties of the hole-extracting layer on the P3HT:PCBM semiconductor layer largely depend on the PEDOT:PSS ratio.

TABLE 3

| PEDOT:PSS | Evaluation of the wetting properties and the film homogeneity |
|---|---|
| 0.4 (not according to the invention) | moderate wetting, dewetting in places |
| 0.67 (according to the invention) | good wetting, film is homogeneous |
| 1.0 (according to the invention) | very good wetting, film is homogeneous |

5. Application of the Metal Anode

Metal electrodes are vapour-deposited on the coated substrate. A vacuum apparatus (Edwards) equipped with two thermal vaporizers which is integrated into the glove box system is used for this. The layer system is covered with a shadow mask which comprises circular holes of 2.5 mm and 6 mm diameter. The substrate is laid on the rotating sample holder with the mounted shadow mask downwards. The dimensions of the sample holder are such that four substrates can be accommodated at the same time. Under a pressure of $p=10^{-3}$ Pa, Ag electrodes are vapour-deposited at a rate of 20 Å/s in a layer thickness of 200 nm.

6. Characterization of the OSC

The characterization of the OSC is likewise carried out in the glove box system filled only with nitrogen. A solar simulator (1,000 W quartz-halogen-tungsten lamp, Atlas Solar Celltest 575), the homogeneous light of which is directed upwards, is recessed into the base of this. An aluminium plate having a circular recess of 2 cm diameter as a holder for the OSC is located in the cone of light. The OSC to be measured is positioned centrally over the recess. The distance from the sample plane to the base is 10 cm. The light intensity can be attenuated with inserted grating filters. The intensity at the sample plane is measured with an Si photocell and is approx. 1000 W/m$^2$. The Si photocell was calibrated beforehand with a pyranometer (CM10). The temperature of the sample holder is determined with a heat sensor (PT100+testtherm 9010) and is max. 40° C. during the measurement.

The OSC is contacted electrically by connecting the ITO electrode to an Au contact pin (+ pole) and pressing a thin flexible Au wire on to one of the metal electrodes (− pole). Both contacts are connected via a cable to a current/voltage source (Keithley 2800). The light source is first covered and the current/voltage characteristic line is measured. For this, the voltage is increased from −1 V to +1 V in increments of 0.01 V and then lowered again to −1 V. The current is recorded at the same time. Thereafter, the characteristic line is plotted analogously under illumination. From these data, the parameters relevant to the solar cell, such as conversion efficiency (efficiency η), open circuit voltage (OCV), short circuit current (SCC) and fill factor (FF), are determined in accordance with the European standard EN 60904-3.

7. Result of the OSC Characterization

Functional solar cells having an efficiency of more than 2% can only be realized in the regions in which the hole-extracting layer is homogeneous. This is achieved only in the layers in which the dispersion has good or very good wetting properties on the P3HT:PCBM layer.

LIST OF REFERENCE SYMBOLS

1 Electrode body
2 Electrode material
3 Dielectric
4 Surface
5 Anode body
6 Solid electrolyte
7 Capacitor body
8 Glass substrate
9 Cathode layer (e.g. aluminium)
10 Further layer (e.g. titanium oxide or zinc oxide)
11 Semiconductor layer (e.g. P3HT or PCBM)
12 Anode layer (PEDOT/PSS)

The invention claimed is:

1. A method for the production of a capacitor, the method comprising:
a) providing an electrode body of an electrode material, wherein a dielectric covers one surface of this electrode material at least partly under formation of an anode body;
b) introducing a dispersion comprising a dispersing agent and complexes of polythiophenes and polyanions, wherein the polythiophene is poly(3,4-ethylenedioxythiophene), the polyanion is a polystyrenesulphonic acid and the weight ratio of poly(3,4-ethylenedioxythiophene):polystyrene-sulphonic acid in the dispersion is at least 0.67 and is less than 1.5, into at least a part of the anode body;
c) removing at least part of the dispersing agent under obtaining a solid electrolyte in a capacitor body.

2. The method of claim 1, wherein the dispersion comprises at least an alkylene glycol, a polyalkylene glycol, a polyglycerol or a mixture of at least two of these.

3. The method of claim 1, wherein the solids content in the dispersion is in a range of from 0.1 to 10 wt. %.

4. A capacitor obtainable by the method of claim 1.

5. A capacitor comprising an electrode body of an electrode material, wherein a dielectric at least partly covers the surface of this electrode material and forms an anode body, wherein the anode body is at least partly coated with a solid electrolyte which comprises polythiophenes and polyanions, wherein the polythiophene is poly(3,4-ethylenedioxythiophene), the polyanion is a polystyrenesulphonic acid and wherein the weight ratio of poly(3,4-ethylenedioxythiophene):polystyrene-sulphonic acid in the solid electrolyte is at least 0.67 and is less than 1.5.

6. The capacitor of claim 5, wherein the solid electrolyte comprises at least one polyalkylene glycol, at least one polyglycerol or a mixture of at least one polyalkylene glycol and at least one polyglycerol.

7. The capacitor of claim 5, wherein the capacitor is an aluminium wound capacitor, a tantalum electrolytic capacitor or an aluminium stacked capacitor.

8. An electronic circuit comprising the capacitor of claim 4.

* * * * *